(12) United States Patent
Dawson et al.

(10) Patent No.: US 7,064,990 B1
(45) Date of Patent: Jun. 20, 2006

(54) METHOD AND APPARATUS FOR IMPLEMENTING MULTIPLE COLUMN REDUNDANCY FOR MEMORY

(75) Inventors: James W. Dawson, Poughkeepsie, NY (US); Thomas J. Knips, Wappingers Falls, NY (US); Donald W. Plass, Poughkeepsie, NY (US); Kenneth J. Reyer, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/053,812

(22) Filed: Feb. 9, 2005

(51) Int. Cl.
*G11C 7/00* (2006.01)

(52) U.S. Cl. ............. 365/200; 365/189.02; 365/230.03

(58) Field of Classification Search .................. None
See application file for complete search history.

(56) References Cited

U.S. PATENT DOCUMENTS

| | | | | |
|---|---|---|---|---|
| 4,471,472 A | * | 9/1984 | Young | 365/200 |
| 5,255,227 A | * | 10/1993 | Haeffele | 365/200 |
| 5,265,054 A | * | 11/1993 | McClure | 365/200 |
| 5,666,312 A | * | 9/1997 | Robertson | 365/189.02 |
| 6,178,127 B1 | * | 1/2001 | Haraguchi | 365/200 |
| 6,507,524 B1 | * | 1/2003 | Agrawal et al. | 365/200 |
| 6,567,323 B1 | * | 5/2003 | Pitts et al. | 365/200 |
| 6,584,023 B1 | * | 6/2003 | Bunce et al. | 365/200 |
| 6,643,166 B1 | | 11/2003 | Ting et al. | 365/154 |
| 2004/0117694 A1 | | 6/2004 | Howlett | 714/710 |
| 2004/0240283 A1 | | 12/2004 | Tellier | 365/200 |
| 2004/0264265 A1 | | 12/2004 | Anano et al. | 365/200 |

* cited by examiner

*Primary Examiner*—Son Mai
(74) *Attorney, Agent, or Firm*—Lynn Augspurger; Cantor Colburn LLP

(57) ABSTRACT

An apparatus for implementing multiple memory column redundancy within an individual memory array includes a plurality of memory array elements internally partitioned into at least a pair of subcolumn elements. At least one spare memory element is configured at a size corresponding to one of the subcolumn elements. An input redundancy multiplexing stage and an output redundancy multiplexing stage are configured for steering around one or more defective memory array elements, and an input bit decoding stage and an output bit decoding stage are configured for implementing an additional, external multiplexing stage with respect to the input redundancy multiplexing stage and the output redundancy multiplexing stage.

17 Claims, 12 Drawing Sheets

METHOD AND APPARATUS FOR IMPLEMENTING MULTIPLE COLUMN REDUNDANCY FOR MEMORY

BACKGROUND

The present invention relates generally to integrated circuit devices, and, more particularly, to a method and apparatus for implementing multiple column redundancy for memory.

Static Random Access Memories (SRAMs) are memory elements that store data in the form of complementary low voltage and high voltage at opposite sides of the memory cell. An SRAM retains the memory value therein so long as power is applied to the circuit, unlike dynamic random access memory (DRAM) that must be periodically refreshed in order for the data to be maintained therein. Conventionally, if the "true" node of an SRAM is read as a high voltage, then the value of the SRAM cell is logical one. Conversely, if the true node is read as a low voltage, the value of the SRAM cell is logical zero.

Due to the high degree of miniaturization possible today in semiconductor technology, the size and complexity of designs that may be implemented in hardware has increased dramatically. This has made it technologically feasible and economically viable to develop high-speed, application specific architectures featuring a performance increase over previous architectures. Process scaling has been used in the miniaturization process to reduce the area needed for both logic functions and memory (such as SRAM) in an effort to lower the product costs.

In order to improve the yield of high-speed, high-density SRAM products, redundant elements are incorporated into the devices. These redundant elements may include for example, row elements, column elements, or both. Generally speaking, the larger the SRAM device, the more repair actions are likely needed for yield improvement. With the availability of multiple row and column repair actions, yield is significantly improved since there is greater flexibility in dealing with the various defect mechanisms. However, one problem associated with multiple repair actions is the difficulty in managing multiple column repair actions, since the outputs of the columns are not decoded and because conventional multiplexing schemes result in performance loss. Moreover, for any amount of column redundancy implemented, the multiplexing must be performed on both column inputs and outputs.

Accordingly, it would be desirable to be able to implement a multiple column redundancy repair scheme in a manner that reduces device real estate and that also minimizes the impact on device performance.

SUMMARY

The foregoing discussed drawbacks and deficiencies of the prior art are overcome or alleviated by an apparatus for implementing multiple memory column redundancy within an individual memory array. In an exemplary embodiment, the apparatus includes a plurality of memory array elements internally partitioned into at least a pair of subcolumn elements. At least two spare memory elements are configured at a size corresponding to one of the subcolumn elements. An input redundancy multiplexing stage and an output redundancy multiplexing stage are configured for steering around one or more defective memory array elements, and an input bit decoding stage and an output bit decoding stage are configured for implementing an additional, external multiplexing stage with respect to the input redundancy multiplexing stage and the output redundancy multiplexing stage.

In another embodiment, a method for implementing multiple memory column redundancy within an individual memory array includes internally partitioning a plurality of memory array elements into at least a pair of subcolumn elements, and configuring at least two spare memory element at a size corresponding to one of the subcolumn elements. An input redundancy multiplexing stage and an output redundancy multiplexing stage are configured for steering around one or more defective memory array elements, and an input bit decoding stage and an output bit decoding stage are configured for implementing an additional, external multiplexing stage with respect to the input redundancy multiplexing stage and the output redundancy multiplexing stage.

In another embodiment, an apparatus for implementing multiple memory column redundancy within an individual memory array includes a plurality of memory array elements internally partitioned into at least a pair of subcolumn elements. At least a pair of spare memory elements is each configured at a size corresponding to one of the subcolumn elements. An input redundancy steering stage includes a plurality of multiplexing devices corresponding to the structure of the internally partitioned memory array elements and the pair of spare memory elements. An output redundancy steering stage includes a plurality of multiplexing devices corresponding to the structure of the internally partitioned memory array elements, the input and output steering redundancy steering stages configured for steering around one or more defective memory array elements. An input bit decoding stage and an output bit decoding stage are configured for implementing an additional, external multiplexing stage with respect to the input redundancy steering stage and the output redundancy steering stage.

BRIEF DESCRIPTION OF THE DRAWINGS

Referring to the exemplary drawings wherein like elements are numbered alike in the several Figures.

DETAILED DESCRIPTION

Disclosed herein is a method and apparatus for implementing multiple SRAM column redundancy repairs, in which a novel implementation of multiplexing is used on the data inputs and outputs to result in two (or more) column repair actions in a given subarray with minimal impact on performance. In particular, the embodiments described herein provide a means of independently steering around at least two different defective column elements, wherein the redundant element(s) is less than the width of a regular I/O device, thus resulting in area savings. Briefly stated, a level of column decoding is implemented outside of the redundant elements, so as to enable the size of those elements to be reduced.

Figure 1:
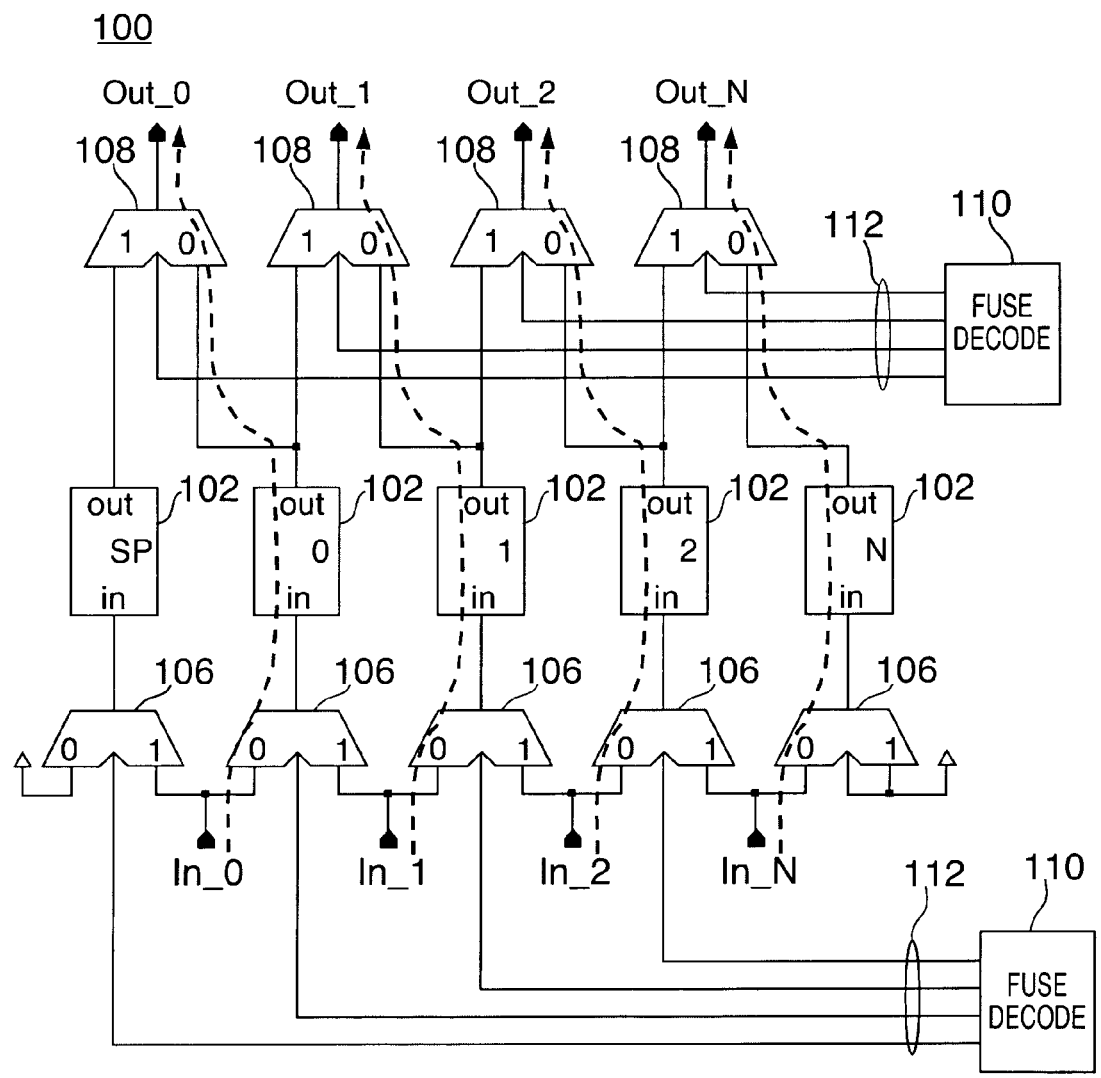
FIG. 1 is a schematic diagram of a conventional column redundancy scheme for an SRAM device.

Referring initially to FIG. 1, there is shown a schematic diagram of a conventional column redundancy scheme for an SRAM array 100. A series of memory elements 102 (labeled 0 through N) are configured within the array 100, in addition to a spare element 104 (labeled SP). In the example depicted, the memory elements 102 and single spare element 104 represent column elements of the array 100. For conventional, single column redundancy, a total of N+2 data input multiplexers 106 are used to receive data from the N+1 data input lines (In_0 through In_N), as is shown in FIG. 1, while a total of N+1 data output multiplexers 108 are used to receive data from the N+1 memory elements 102 and spare element 104. The selected data input to data output multiplexers 108 are fed to the N+1 data output lines Out_0 through Out_N. Fuse decode logic 110 provides control signals 112 to the input multiplexers 106 and 108 to implement the appropriate steering from the data input lines, through the memory elements, and to the data output lines.

Figure 2:
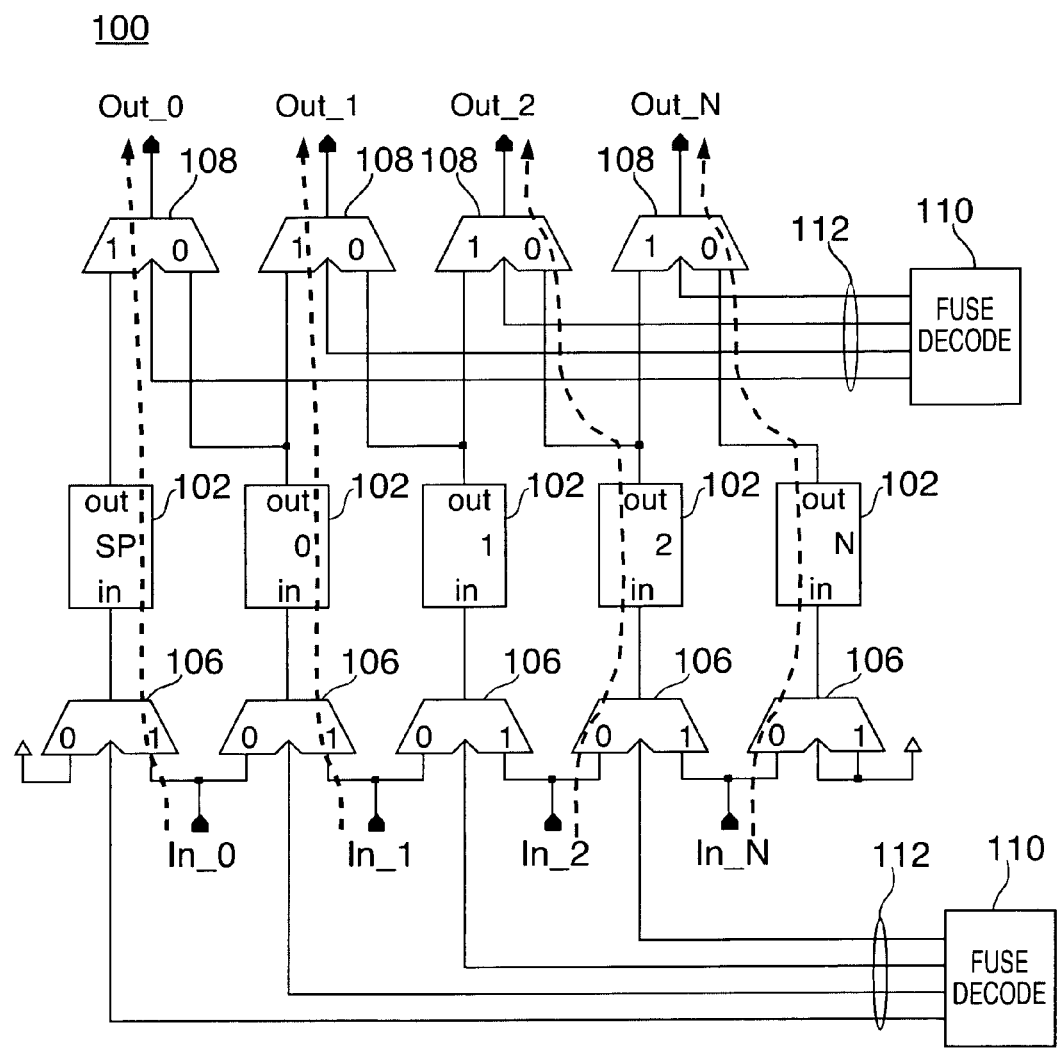
FIG. 2 illustrates the column redundancy scheme of FIG. 1 where the steering logic is used to steer around a single defective column.

As indicated by the dashed arrows in FIG. 1, there are no defects within any of the memory elements. Thus, each data path through the array 100 follows its conventionally designed path; i.e., the data on line In_0 is routed through memory element 0 and out on line Out_0, the data on line In_1 is routed through memory element 1 and out on line Out_1, etc. However, as shown in FIG. 2, memory element 1 is found to be defective. In this instance, a single column redundancy operation causes the In/Out_0 data path to be rerouted through the spare memory element 104 while the In/Out_1 data path is rerouted through memory element 0. The In/Out_2 and In/Out_3 data path are routed as normal through corresponding memory elements 2 and 3. Although such a scheme adequately addresses a scenario in which there is a single defect in the array, larger SRAM devices increase the possibility of multiple repair actions to increase the production yield. Unfortunately, a multiple repair scheme using the above methodology is not easily achieve while still maintaining desired array performance.

Figure 3A:
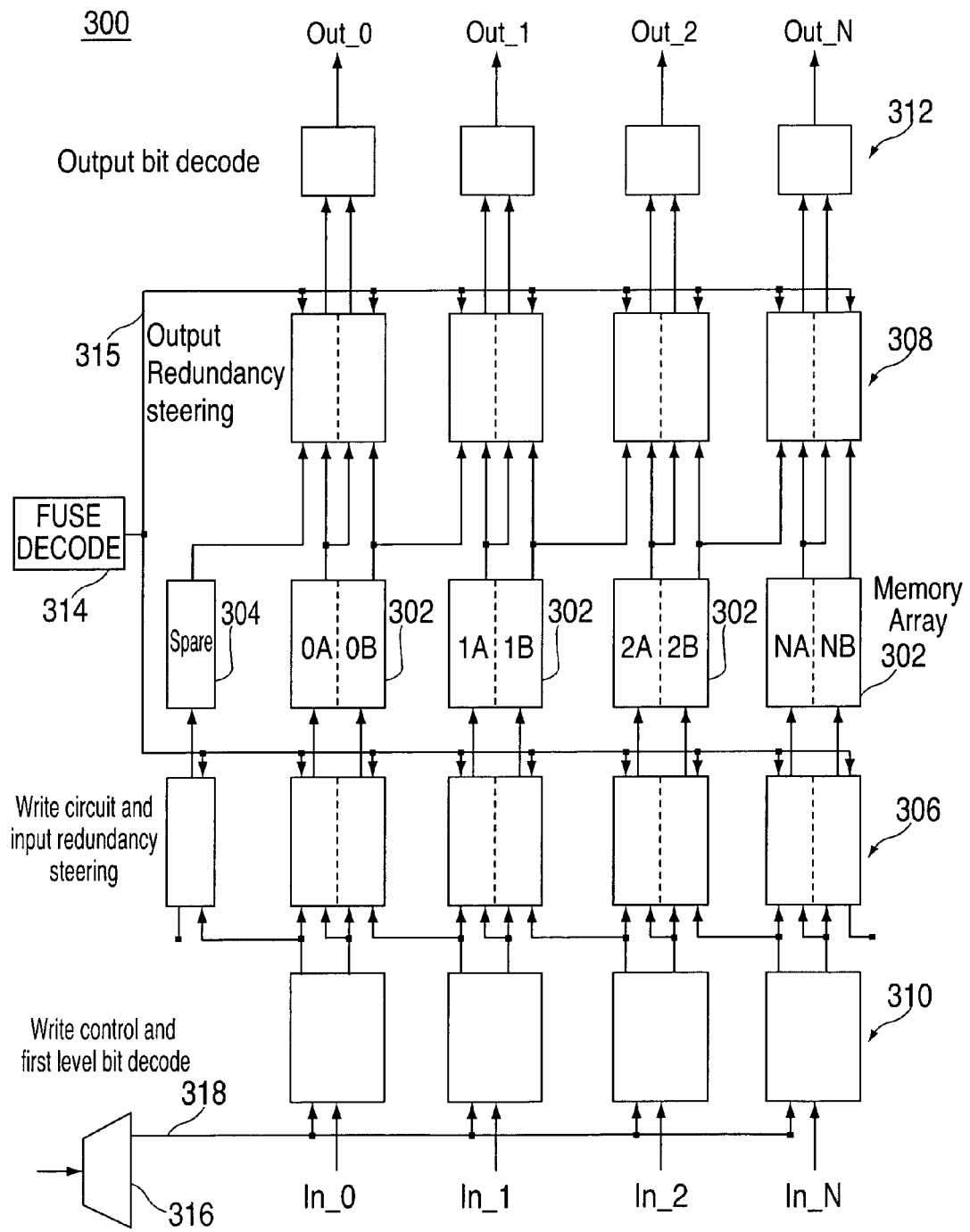
FIG. 3(a) is a schematic diagram of an apparatus for implementing a column redundancy scheme for an SRAM device, in accordance with an embodiment of the invention.

Therefore, in accordance with an embodiment of the invention, FIG. 3(a) is a schematic diagram of an apparatus 300 for implementing a column redundancy scheme for an SRAM array, wherein external multiplexing operations allow a spare element to be configured smaller than the size of a regular element. As is conceptually depicted, the memory array elements 302 (0 through N) are conceptually divided into two subcolumns, A and B. A spare element 304 may therefore be configured in accordance with size of a subcolumn. Whereas the memory elements of the conventional redundancy scheme shown in FIGS. 1 and 2 are shown with a single input/output data path, the exemplary apparatus 300 of FIG. 3(a) provides a second data input and output path from the memory array elements. The input/output data paths could also be configured at higher multiples of two for additional repairs.

Correspondingly, an input and an output redundancy multiplexing stage (e.g., a set of input redundancy steering multiplexers 306 and output redundancy steering multiplexers 308) are configured to perform steering operations through adjacent subcolumns. In order to provide a second set of input/output data paths to and from the memory elements 302, a external level of input and output multiplexing is implemented with respect to the memory elements 302. More specifically, an input bit decode stage 310 is used to double the signal path for each data input line (In_0 through In_N). This additional level of input decoding may be incorporated into existing write control circuitry, and thus will have minimal impact on device real estate. On the output end, an output bit decode stage 312 is used to decode the double data output paths back to single output lines Out_0 through Out_N. As is the case with the prior schemes, the fuse decoding logic 314 is still used to implement the remaining "internal" multiplexing steering by providing independently programmed control signals on a bus 315 to the input redundancy steering multiplexers 306 and output redundancy steering multiplexers 308. A bit address multiplexer 316 sends a bit select signal 318 that determines which "side" (A or B) of the array elements data would nominally be passed through with no defects present. Again, it should be understood the signal input data paths could also be split into higher multiples of two and converted back to corresponding single output data paths.

Figure 3B:
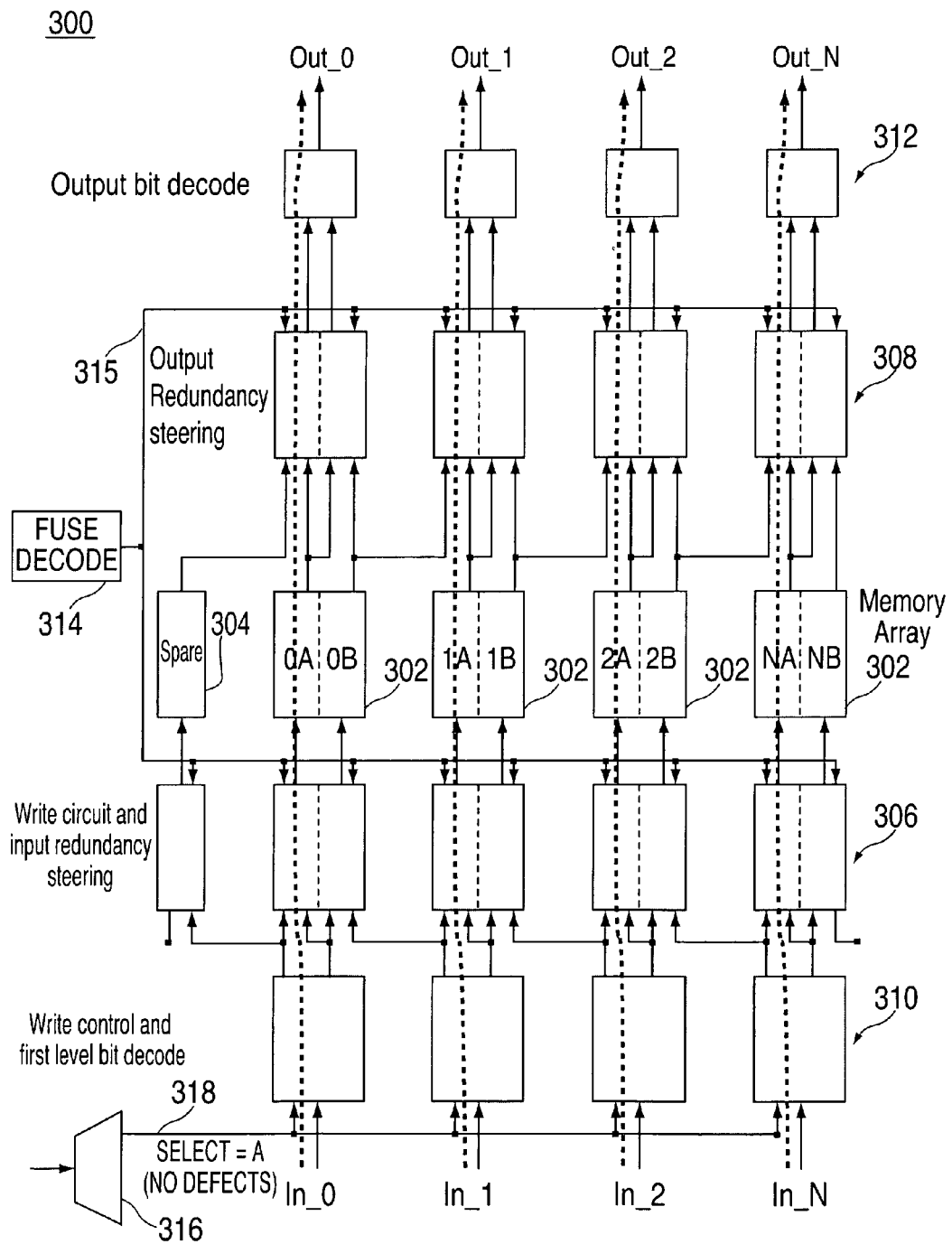
FIGS. 3(b) through 3(d) illustrate exemplary redundancy steering scenarios achievable through the apparatus of FIG. 3(a)

FIG. 3(b) illustrates a first scenario for the redundancy apparatus 300, in which there are no memory column defects. The bit select signal corresponds to path A, and thus each input data path (dashed arrows) is nominally steered through the A side of the corresponding input multiplexers 306, through the A side of the corresponding memory array elements 302, and through the A side of corresponding output multiplexers 308 before being externally decoded at stage 312. It will also be understood that the B path of the steering and memory devices could also have been selected for a non-defective structure.

Figure 3C:
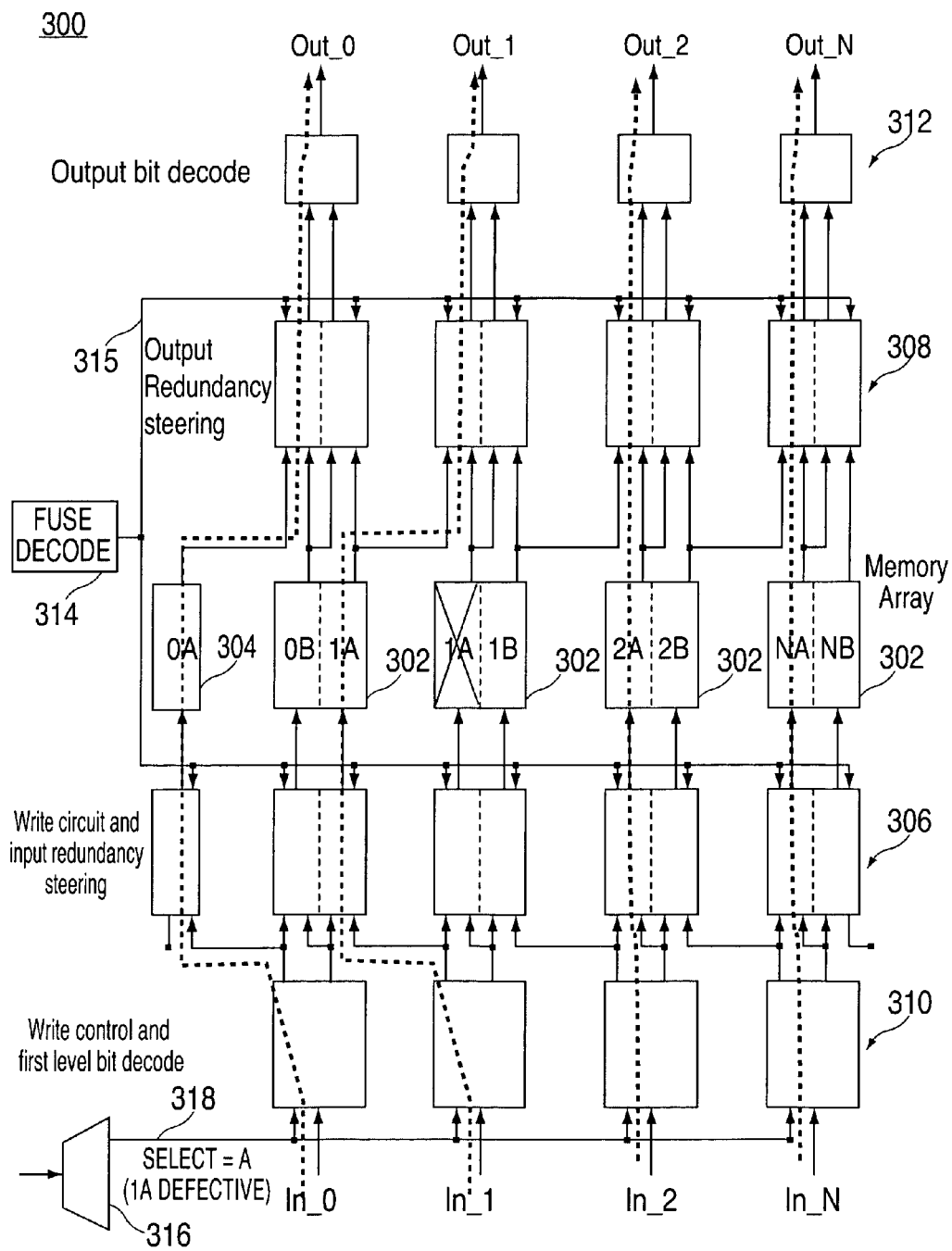

In contrast, FIG. 3(c) illustrates another scenario for the redundancy apparatus 300, in which the A side of memory element 1 is defective. As such, the functions of the defective A side of memory element 1 are now realized by the next available subcolumn in the direction of the spare element (i.e., by the former B side of element 0). The re-labeling of the memory subcolumns to the left of defective subcolumn 1A is shown in FIG. 3(c), reflecting the use of the spare subcolumn element 304.

Accordingly, the data from In_0 is shifted through the left most input steering multiplexer (i.e., the "spare" input steering multiplexer), through the spare memory element 304 (which now includes the A side of memory element 0), through the A side of the corresponding output steering multiplexer, and out through the output bit decode stage 312. In addition, the data from In_1 is steered left through the B side of the input steering multiplexer corresponding to memory element 0, through the former B side of memory element 0 (which now contains the A side of memory element 1), and then steered back right through the A side of the output steering multiplexer corresponding to memory element 1, thus effectively steering around defective portion 1A. Since the subcolumns of memory elements 2 through N are located on the other side of the defect 1A, the data paths In_2 through In_N are nominally steered through the A side of the corresponding multiplexing and memory devices.

Figure 3D:
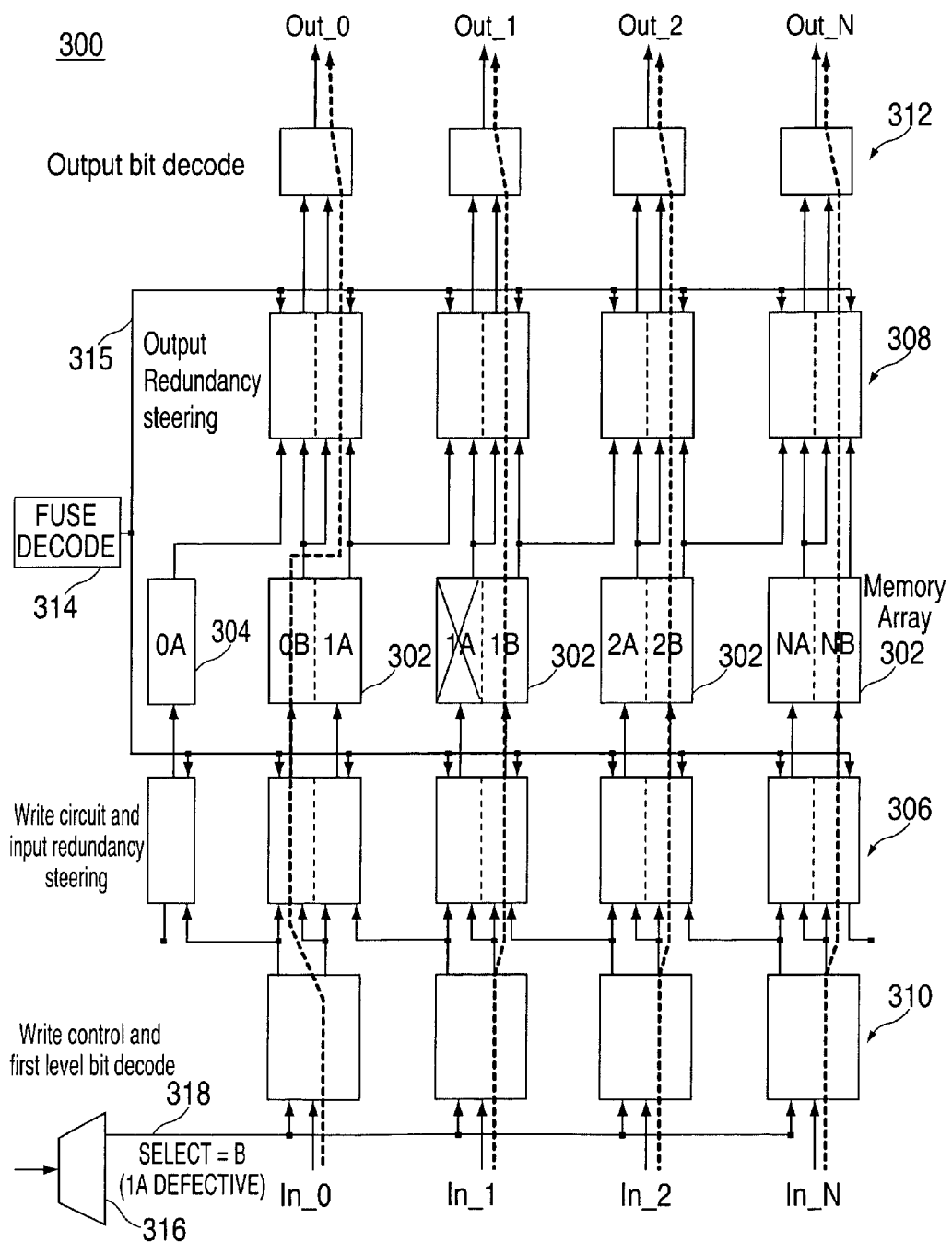

FIG. 3(d) illustrates the same defect scenario of memory element 1A as in FIG. 3(c). However, in this instance the selected path by bit signal 318 is path B. As is shown, the nominal B side data paths of In_2 through In_N are once again unaffected by the defect in element 1A. Moreover, since side B is selected in this example, the nominal path of the data on line In_1 is also unaffected in this instance since the 1B subcolumn still physically resides in memory element 1. Again, functional subcolumns 0A, 0B and 1A are all shifted over by one place to the left. Thus, the data path from input In_0 is now directed through the nominal A side of input steering multiplexer 306, through the left subcolumn of element 0 and through the nominal B side of output steering multiplexer 308.

Figure 4A:
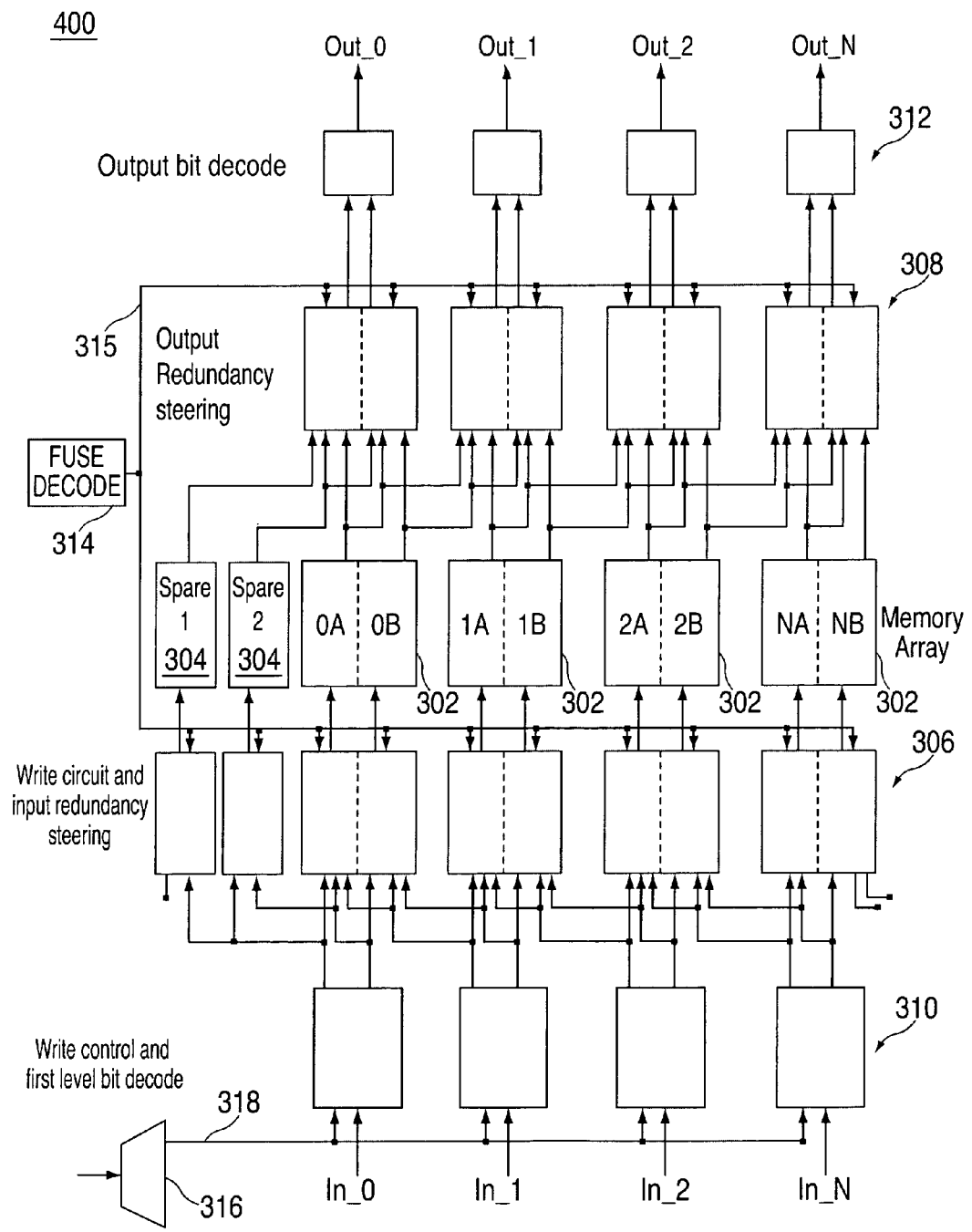
FIG. 4(a) is a schematic diagram of an apparatus for implementing a multiple column redundancy scheme for an SRAM device, in accordance with a further embodiment of the invention.

The advantages of the above described redundancy scheme become even more apparent upon consideration of the embodiment depicted in FIG. 4(a). As is particularly shown, the redundancy scheme 400 of FIG. 4(a) includes two spare elements 304 (Spare 1, Spare 2) so as to accommodate appropriate steering in the event that defects are present in two different subcolumn elements. Because a given data path may now potentially be shifted two subcolumn spaces from the nominal path, the additional wiring from the input bit decode stage 310 to the input steering multiplexers 306, and from the memory elements 302 to the output steering multiplexers 308 will be noted.

Figure 4B:
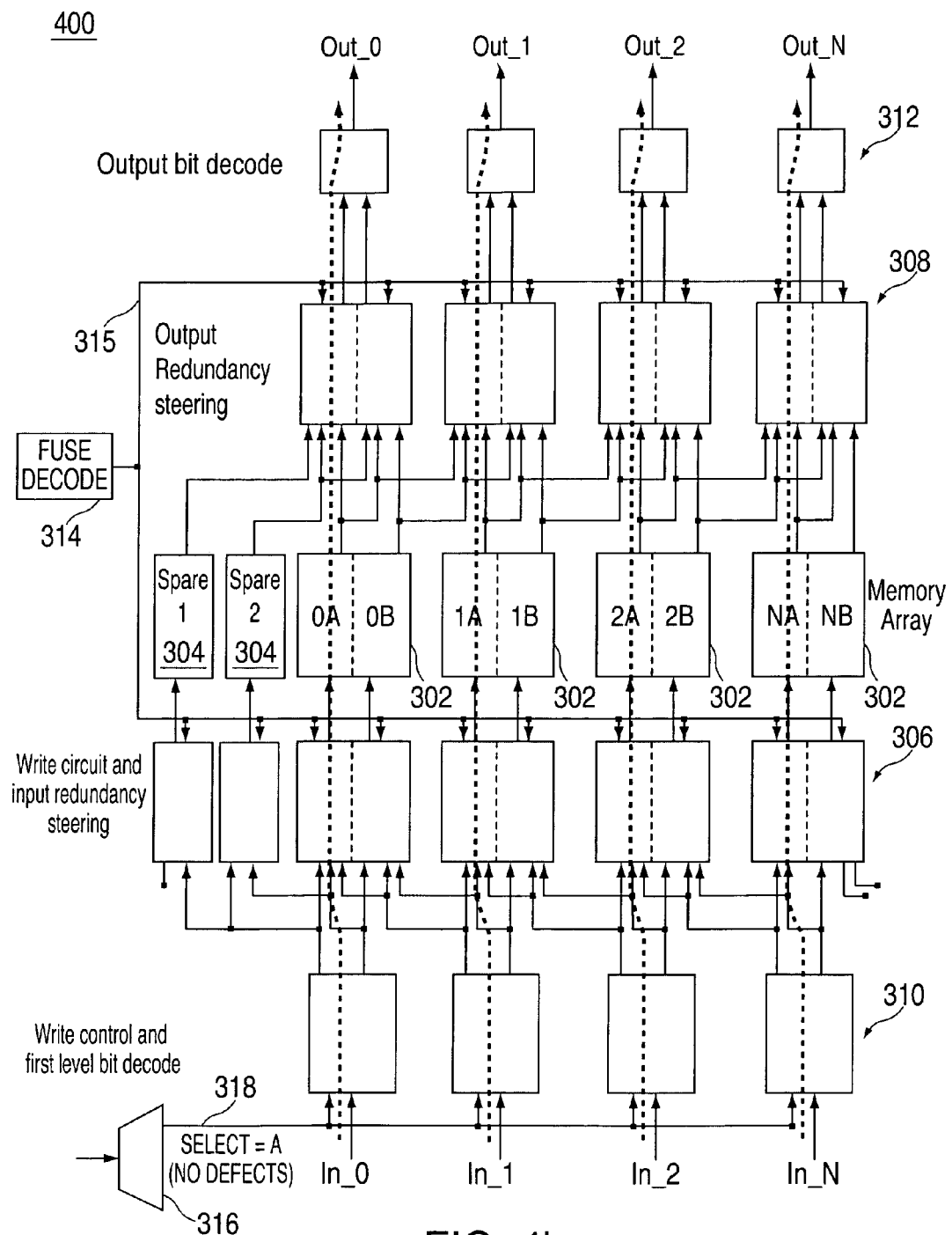
FIGS. 4(b) through 4(e) illustrate exemplary redundancy steering scenarios achievable through the apparatus of FIG. 4(a)

FIG. 4(b) illustrates a first scenario for the redundancy apparatus 400, in which there are no memory column defects. The bit select signal corresponds to path A, and thus each input data path (dashed arrows) is nominally steered through the A side of the corresponding input multiplexers 306, through the A side of the corresponding memory array elements 302, and through the A side of corresponding output multiplexers 308 before being externally decoded at stage 312. It will also be understood that the B path of the steering and memory devices could also have been selected for a non-defective structure.

Figure 4C:
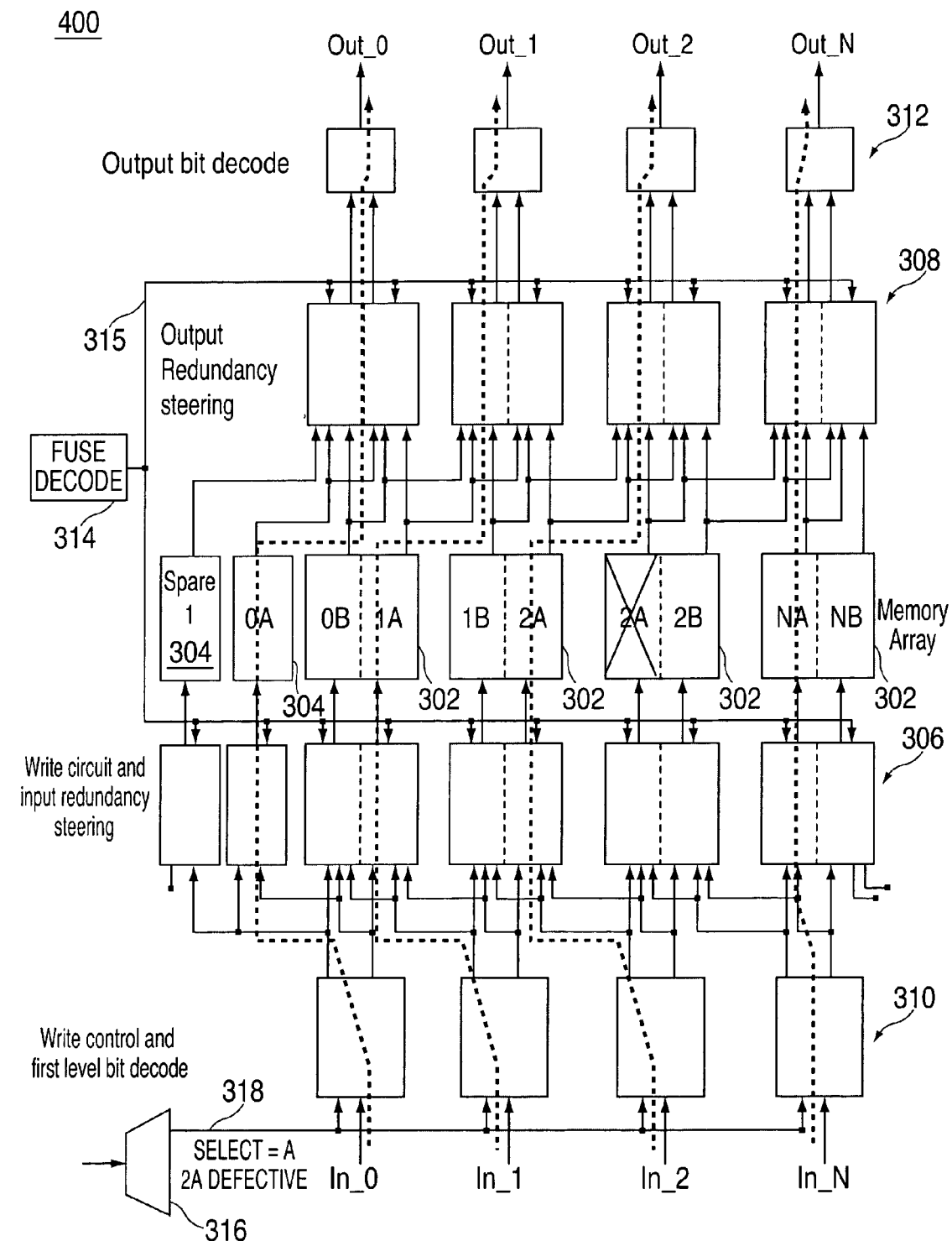

In contrast, FIG. 4(c) illustrates another scenario for the redundancy apparatus 400, in which the A side of memory element 2 is defective. As such, the functions of the defective A side of memory element 2 are now realized by the next available subcolumn in the direction of the spare element (i.e., by the former B side of element 1). The re-labeling of the memory subcolumns to the left of defective subcolumn 2A is shown in FIG. 4(c), reflecting the use of the formerly designated "Spare 2" subcolumn element 304.

Accordingly, the data from In_2 is shifted through the input steering multiplexer corresponding to memory element 1, through the right side of memory element 1 (now labeled 2A), back through the A side of the output steering multiplexer corresponding to memory element 2, and out through the output bit decode stage 312, thus effectively steering around defective portion 2A. Similarly, the data from In_1 is steered left through the B side of the input steering multiplexer corresponding to memory element 0, through the former B side of memory element 0 (which now contains the A side of memory element 1), and then steered back right through the A side of the output steering multiplexer corresponding to memory element 1. This in turn results in the data from In_0 being steered left through the right side of the spare input steering multiplexer, through the former Spare 2 subcolumn (which now contains the A side of memory element 0), and then steered back right through the A side of the output steering multiplexer corresponding to memory element 0.

Figure 4D:
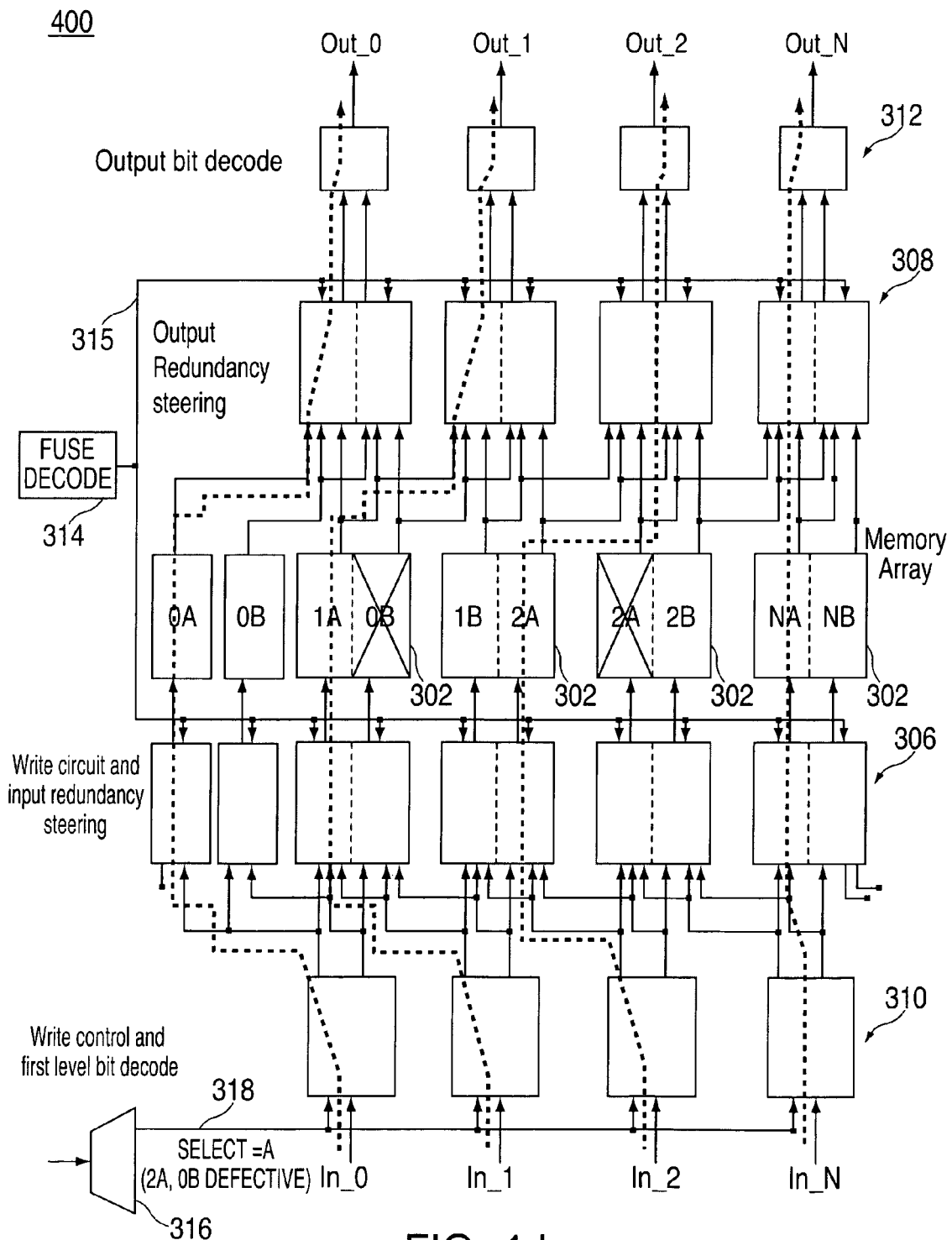

FIG. 4(d) now illustrates a scenario in which there are two defective memory subcolumn elements, 2A and 0B, with the A side of the elements being selected by bit select signal 318. As was the case in FIG. 4(c), the nominal data paths of data line In_N is unaffected, while the data path of In_2 is routed through the former B side of memory element 1. However, since subcolumn 0B is also defective, memory element subcolumn 1A is now shifted over two places to occupy the originally designated subcolumn 0A. Memory element subcolumns 0A and 0B are in turn also shifted over two places to occupy both spare elements 304. Accordingly, the data paths of both In_1 and In_0 are shifted two places to the left by the input steering multiplexer stage 306.

Figure 4E:
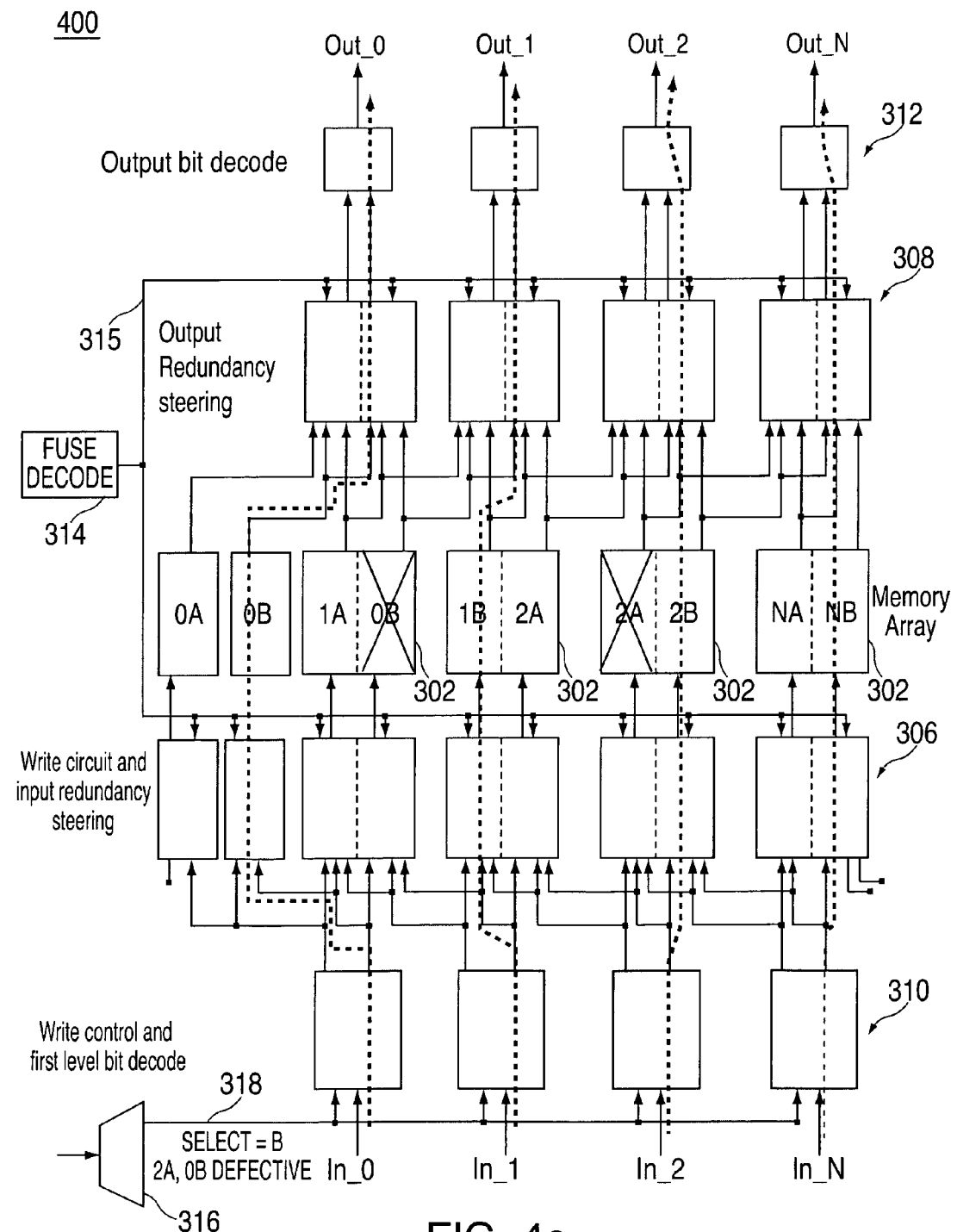

In FIG. 4(e), the same two memory subcolumns 2A and 0B are defective, but in this example the B side of the array elements is selected by signal 318. Because element 2B is not defective, the data on line In_2 is not be steered from its nominal path. The data on line In_1 is still passed through memory element 1, but is steered over one place to the former A side thereof. Due to the second defective element, the date on In_0 is steered two places over through one of the spare elements 304.

Figure 5:
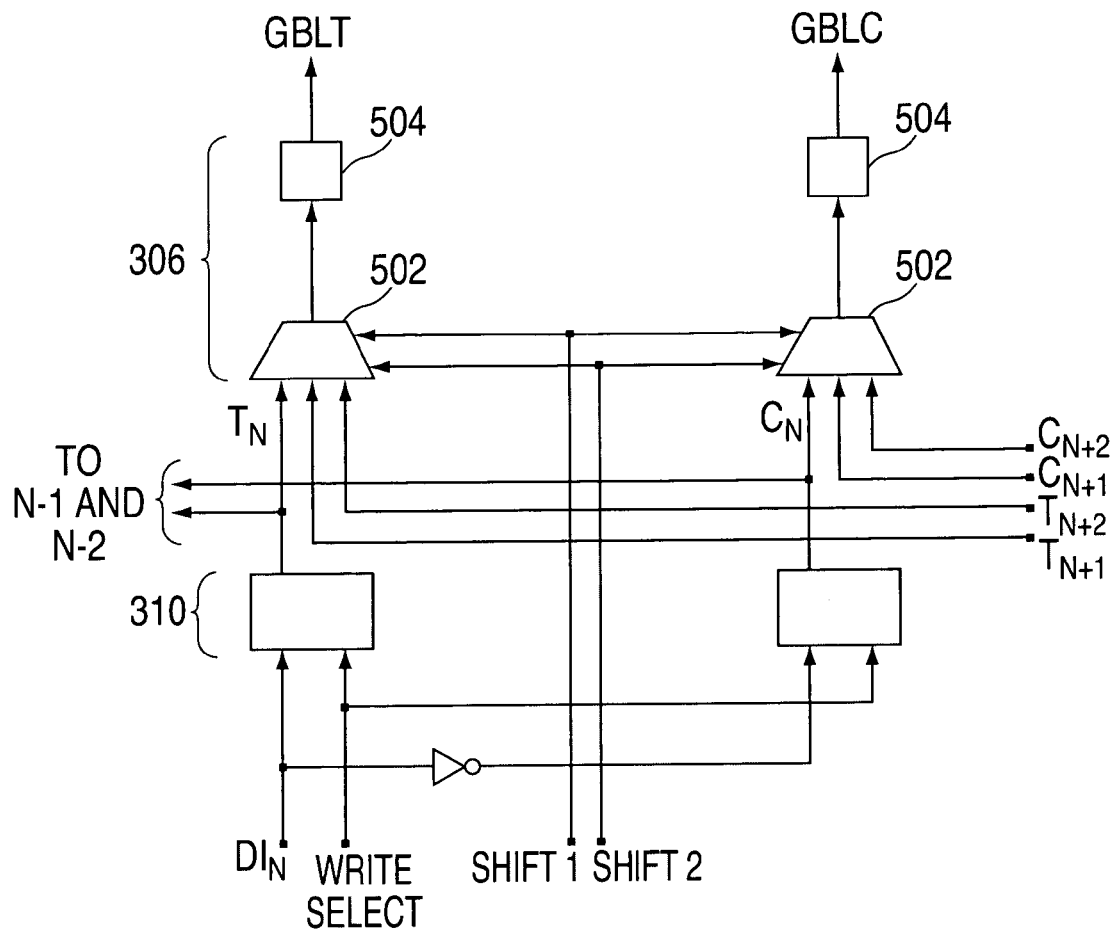
FIG. 5 is a schematic diagram of one possible multiplexing implementation of the input redundancy steering stage of FIG. 4(a)

FIG. 5 is a schematic diagram of one possible multiplexing implementation of the input bit decode stage 310 and input redundancy steering stage 306 of FIG. 4(a). As will be recalled from above, a data input ($DI_N$) to the input bit decode stage 310 is accompanied by a bit (write) select signal that gates the data through the input decode stage if the corresponding subcolumn (A or B side) is selected. The passed data is selectively directed through one of (at least) three paths: a first path for no repair steering, a second path for a one subcolumn shift, or a third path for a two subcolumn shift. As shown in FIG. 5, a first (nominal) path $T_N$ for a given data line $DI_N$ is input to one multiplexing device 502 in the redundancy steering stage, while the second (N−1) and third (N−2) paths are directed to adjacent corresponding multiplexing devices (not shown) in the redundancy steering stage 306. Conversely, the multiplexing device 502 also receives a second input ($T_{N+1}$) from an N+1 shift path corresponding to $DI_{N+1}$ and a third input ($T_{N+2}$) from an N+2 shift path corresponding to $DI_{N+2}$.

For purposes of illustration, it will also be recognized that the complementary bit on the data input line is sent to a complementary side of the input bit decode stage 310 and input redundancy steering stage 306. Thus, the "true" data paths are designated $T_N$, $T_{N+1}$, $T_{N+2}$, etc., while the "complementary" data paths are designated $C_N$, $C_{N+1}$, $C_{N+2}$, etc. In this illustrated example, since the input redundancy steering stage multiplexers 502 provide 3:1 multiplexing, there are two control signals (SHIFT 1, SHIFT 2) applied thereto as shown in FIG. 5. The particular values of the control signals (SHIFT 1, SHIFT 2) that result in a particular one-of-three steering path will depend on the specific device topology used to realize the multiplexers 502. In any case, the selected output path of multiplexer 502 is also shown inputted into a global bitline driver stage 504, which may include such devices as a half-latch and a precharge device (as known in the art). Moreover, although the output of the corresponding driver stage 504 for the true data side is designated GBLT and the output of the corresponding driver stage 504 for the complementary data side is designated GBLC, this may be reversed in accordance with well-known inversion circuit implementations. That is, the output of the driver stage on the true data side is on the complementary global bitline, while the output of the driver stage on the complementary data side is on the true global bitline.

Figure 6:
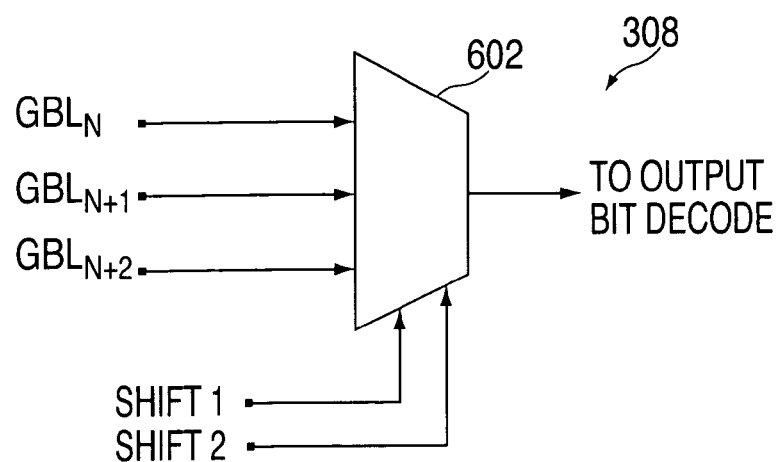
FIG. 6 is a schematic diagram of one possible multiplexing implementation of the output redundancy steering stage of FIG. 4(a).

Finally, FIG. 6 is a schematic diagram of one possible multiplexing implementation of the output redundancy steering stage 308 of FIG. 4(a). It will be noted that only a true data side 3:1 multiplexer 602 is shown for a given output data path in FIG. 6. As is shown, the multiplexer receives three global bitline (true) data inputs: a first path ($GBL_N$) for no repair steering, a second path ($GBL_{N+1}$) for a one subcolumn shift, and a third path ($GBL_{N+2}$) for a two subcolumn shift. As is the case for the input redundancy steering stage, the one-of-three output selection is implemented through control signals SHIFT 1, SHIFT 2. In embodiments where more than two repairs are desired, additional control signals may be provided to perform multiplexing on a larger number of potential input/output steering paths.

As will thus be appreciated, through the use of an external level of multiplexing in addition to the input and output steering stages, at least two independent column repair actions may be achieved for a given subarray without a significant increase in device complexity or performance. Moreover, the methodology disclosed herein does not dictate the size of a spare element to be the same width as a full memory element due to the internal partitioning. As will also be appreciated, the concepts described herein can further be extended to perform 3 or more independent column repair operations.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An apparatus for implementing multiple memory column redundancy within an individual memory, comprising:
    a plurality of memory array elements internally partitioned into at least a pair of subcolumn elements;
    at least two spare memory elements, said spare memory elements each configured at a size corresponding to one of said subcolumn elements;
    an input redundancy multiplexing stage and an output redundancy multiplexing stage configured for steering around one or more defective memory array elements; and
    an input bit decoding stage and an output bit decoding stage configured for implementing an additional, external multiplexing stage with respect to said input redundancy multiplexing stage and said output redundancy multiplexing stage.

2. The apparatus of claim 1, wherein said input bit decoding stage is configured to receive an input data line corresponding to each of said plurality of memory array elements, and a bit select signal corresponding to one of said pair of subcolumn elements.

3. The apparatus of claim 2, wherein said input decoding stage is configured to provide a pair of input data paths to each of said memory elements, corresponding to said pair of subcolumn elements.

4. The apparatus of claim 2, wherein said input redundancy multiplexing stage is configured to programmably steer data, from each of said pairs of input data paths from said input decoding stage, up to at least two subcolumn units in the direction of said at least two spare memory elements.

5. The apparatus of claim 4, wherein for N number of memory array elements, said output redundancy multiplexing stage is configured to programmably steer data from each of a pair of output data paths of the first N−1 number of memory array elements, up to at least two subcolumn units away from the direction of said at least two spare memory elements.

6. The apparatus of claim 1, wherein said input bit decoding stage is incorporated into write control circuitry for the memory array elements.

7. A method for implementing multiple memory column redundancy within an individual memory array, the method comprising:
    internally partitioning a plurality of memory array elements into at least a pair of subcolumn elements;
    configuring at least two spare memory elements at a size corresponding to one of said subcolumn elements;
    configuring an input redundancy multiplexing stage and an output redundancy multiplexing stage for steering around one or more defective memory array elements; and
    implementing an additional, external multiplexing stage with respect to said input redundancy multiplexing stage and said output redundancy multiplexing stage through an input bit decoding stage and an output bit decoding stage.

8. The method of claim 7, wherein said input bit decoding stage is configured to receive an input data line corresponding to each of said plurality of memory array elements, and a bit select signal corresponding to one of said pair of subcolumn elements.

9. The method of claim 8, wherein said input decoding stage is configured to provide a pair of input data paths to each of said memory elements, corresponding to said pair of subcolumn elements.

10. The method of claim 8, wherein said input redundancy multiplexing stage is configured to programmably steer data, from each of said pairs of input data paths from said input decoding stage, at least two subcolumn units in the direction of said at least two spare memory elements.

11. The method of claim 10, wherein for N number of memory array elements, said output redundancy multiplexing stage is configured to programmably steer data from each of a pair of output data paths of the first N−1 number of memory array elements, at least two subcolumn units away from the direction of said at least two spare memory elements.

12. An apparatus for implementing multiple memory column redundancy, within an individual memory array, comprising:
    a plurality of memory array elements internally partitioned into at least a pair of subcolumn elements;
    at least a pair of spare memory elements, each of said spare memory element configured at a size corresponding to one of said subcolumn elements;
    an input redundancy steering stage comprising a plurality of multiplexing devices corresponding to the structure of said internally partitioned memory array elements and said pair of spare memory elements;
    an output redundancy steering stage comprising a plurality of multiplexing devices corresponding to the structure of said internally partitioned memory array elements, said input and output steering redundancy steering stages configured for steering around one or more defective memory array elements; and
    an input bit decoding stage and an output bit decoding stage configured for implementing an additional, external multiplexing stage with respect to said input redundancy steering stage and said output redundancy steering stage.

13. The apparatus of claim 12, wherein said input bit decoding stage is configured to receive an input data line corresponding to each of said plurality of memory array elements, and a bit select signal corresponding to one of said pair of subcolumn elements.

14. The apparatus of claim 13, wherein said input decoding stage is configured to provide a pair of input data paths to each of said memory elements, corresponding to said pair of subcolumn elements.

15. The apparatus of claim 13, wherein said input redundancy steering stage is configured to programmably steer data, from each of said pairs of input data paths from said input decoding stage, up to at least two subcolumn units in the direction of said pair of spare memory elements.

16. The apparatus of claim 15, wherein for N number of memory array elements, said output redundancy steering stage is configured to programmably steer data from each of a pair of output data paths of the first N−1 number of memory array elements, up to at least two subcolumn units away from the direction of said pair of spare memory elements.

17. The apparatus of claim 12, wherein said input bit decoding stage is incorporated into write control circuitry for the memory array elements.

* * * * *